(12) United States Patent
Jan

(10) Patent No.: US 7,772,935 B2
(45) Date of Patent: Aug. 10, 2010

(54) OSCILLATOR VOLTAGE SOURCE CIRCUITS

(75) Inventor: Shiun-Dian Jan, Taipei County (TW)

(73) Assignee: Princeton Technology Corporation, Hsin Tien, Taipei County (TW)

( * ) Notice: Subject to any disclaimer, the term of this patent is extended or adjusted under 35 U.S.C. 154(b) by 64 days.

(21) Appl. No.: 12/043,713

(22) Filed: Mar. 6, 2008

(65) Prior Publication Data

US 2009/0146753 A1    Jun. 11, 2009

(30) Foreign Application Priority Data

Dec. 10, 2007    (TW)    ............... 96146986 A

(51) Int. Cl.
*H03B 5/24*    (2006.01)
*H03K 3/03*    (2006.01)
*H03L 1/00*    (2006.01)

(52) U.S. Cl. .................. 331/185; 331/57; 331/186

(58) Field of Classification Search .................. 331/57, 331/185, 186
See application file for complete search history.

(56) References Cited

U.S. PATENT DOCUMENTS 5,212,460 A * 5/1993 Tamagawa ............ 331/116 FE
6,002,354 A * 12/1999 Itoh et al. .................. 341/144
6,304,148 B1 * 10/2001 Nomura et al. ............ 331/57
7,002,869 B2 * 2/2006 Zhang et al. ............... 365/226

* cited by examiner

*Primary Examiner*—David Mis
(74) *Attorney, Agent, or Firm*—Muncy, Geissler, Olds & Lowe, PLLC

(57) ABSTRACT

A power source circuit for an oscillator is provided comprising a multiplexer, a plurality of transmission gates, a plurality of resistors, a current source circuit, and an output circuit. The multiplexer inputs a digital signal and outputs one or more control signals. The transmission gates is individually coupled to the multiplexer and receives the one or more control signals, wherein each of the plurality of transmission gates are turned on or off according to the one or more control signals. The plurality of resistors is coupled in series and individually coupled to the plurality of transmission gates. The current source circuit is coupled to the plurality of resistors and provides a current source. The output circuit is coupled to the current source and provides output power for the oscillator according to the current source and the operation of the transmission gates.

8 Claims, 1 Drawing Sheet

OSCILLATOR VOLTAGE SOURCE CIRCUITS

BACKGROUND OF THE INVENTION

1. Field of the Invention

The invention relates to an oscillator voltage source circuit, and more particularly to an oscillator voltage source circuit for reducing voltage deviation and controlling voltage easily.

2. Description of the Related Art

In general, a current-starved ring oscillator requires a constant current basing scheme or a feedback loop, so that current-controlled delay stages are charged or discharged, and delay units are formed in a feedback ring loop to generate oscillation.

A voltage source circuit of a ring oscillator is usually composed of a current source, transmission gates, and resistors, and charging and discharging operations are preformed through the resistors with different impedance. Current is generated by the current source according to a path which is manually selected. During duration of current generation, voltage source deviation occurs due to different number of transmission gates whereby the generated current passes, resulting in shift in an output frequency of the oscillator.

Thus, it is an important issue to solve the voltage source deviation and simplify charging/discharging processes.

BRIEF SUMMARY OF THE INVENTION

An exemplary embodiment of a power source circuit for an oscillator comprises a multiplexer, a plurality of transmission gates, a plurality of resistors, a current source circuit, and an output circuit. The multiplexer inputs a digital signal and outputs one or more control signals. The transmission gates are individually coupled to the multiplexer and receive the one or more control signals, wherein each of the plurality of transmission gates are turned on or off according to the one or more control signals. The plurality of resistors is coupled in series and individually coupled to the plurality of transmission gates. The current source circuit is coupled to the plurality of resistors and provides a current source. The output circuit is coupled to the current source and provides output power according to the current source and the operation of the transmission gates.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
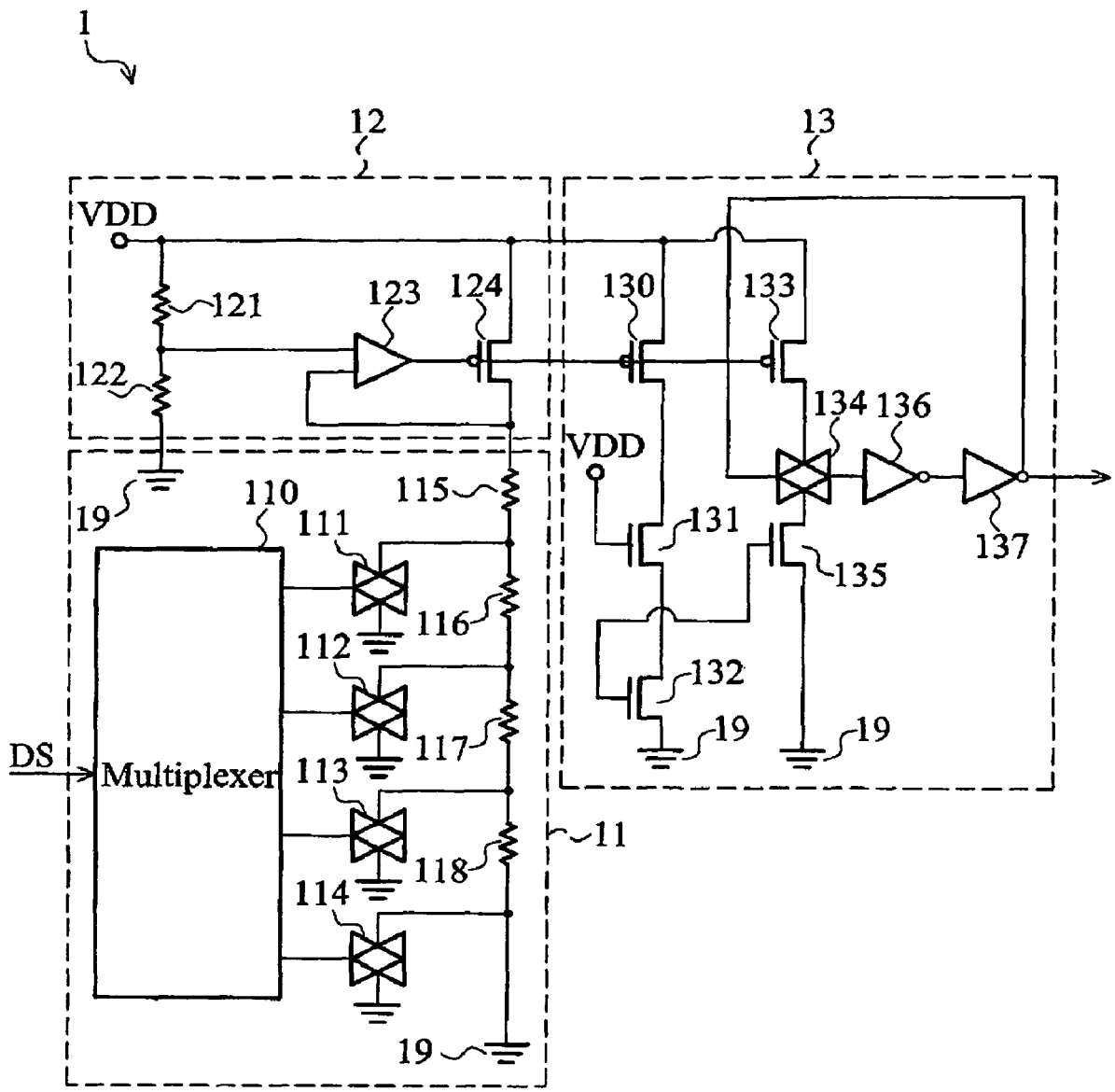
FIG. 1 is an exemplary embodiment of an oscillator voltage source circuit.

The following description is of the best-contemplated mode of carrying out the invention. This description is made for the purpose of illustrating the general principles of the invention and should not be taken in a limiting sense. The scope of the invention is best determined by reference to the appended claims.

Oscillator power source circuits are provided. In an exemplary embodiment of an oscillator voltage source circuit as shown in FIG. 1, an oscillator voltage source circuit 1 comprises a control circuit 11, a current circuit 12, and an output circuit 13. The control circuit 11 comprises multiplexer 110, first to fourth transmission gates 111-114, first to fourth resistors 115-118, and a ground 119. The multiplexer 110 receives a digital signal DS and selectively outputs the digital signal DS to the first to fourth transmission gates 111-114. The first to fourth transmission gates 111-114 are coupled to the multiplexer 110 individually and receive the digital signal DS from the multiplexer 110. The first to fourth transmission gates 111-114 are individually turned on or off according to the digital signal DS.

A first terminal of the first resistor 115 is coupled to the current source circuit 12, and a second terminal thereof is coupled to the first transmission gate 111. A first terminal of the second resistor 116 is coupled to the second terminal of the first resistor 115, and a second terminal thereof is coupled to the second transmission gate 112. A first terminal of the third resistor 117 is coupled to the second terminal of the second resistor 116, and a second terminal thereof is coupled to the third transmission gate 113. A first terminal of the fourth resistor 118 is coupled to the second terminal of the third resistor 117, and a second terminal thereof is coupled to the ground 119. In some embodiments, the first to fourth transmission gates 111-114 can be replaced by N-type metal oxide semiconductor (NMOS) transistors, and the same functions can be achieved.

The current source circuit 12 comprises a voltage source VDD, fifth and sixth resistors 121 and 122, a comparator 123, and a first PMOS transistor 124. The voltage source VDD is coupled to a first terminal of the fifth resistor 121 and a source of the first PMOS 124 for providing a stable voltage source. A second terminal of the fifth resistor 121 is coupled to a first terminal of the sixth resistor 122 and a first input terminal of the comparator 123. The second terminal of the sixth resistor 122 is coupled to the ground 119. A gate of the first PMOS transistor 124 is coupled to an output terminal of the comparator 123, and a drain thereof is coupled to a second input terminal of the comparator 123.

The output circuit 13 comprises a second PMOS transistor 130, a first NMOS transistor 131, a second NMOS transistor 132, a third PMOS transistor 133, a fifth transmission gate 134, a third NMOS transistor 135, a first inverter 136, and a second inverter 137.

A source of the second PMOS transistor 130 is coupled to the voltage source VDD, a gate thereof is coupled to the gate of the first PMOS transistor 124, and a drain thereof is coupled to a source of the first NMOS transistor 131. A gate of the first NMOS transistor 131 is coupled to the voltage source VDD, and a drain thereof is coupled to a source of the second NMOS transistor 132. A gate of the second NMOS transistor 132 is coupled to a gate of the third NMOS transistor 135, and a drain thereof is coupled to the ground 110. A source of the third PMOS transistor 133 is coupled to the voltage source VDD, a gate thereof is coupled to the gate of the second PMOS transistor 130, and a drain thereof is coupled to a first terminal of the fifth transmission gate 134. A second terminal of the fifth transmission gate 134 is coupled to the source of the third NMOS transistor 135, a third terminal thereof is coupled to an output terminal of the second inverter 137, and a fourth terminal thereof is coupled to an input terminal of the first inverter 136. A drain of the third NMOS transistor 135 is coupled to the ground 119. An output terminal of the first inverter 136 is coupled to an input terminal of the second inverter 137. The output terminal of the second inverter 137 is coupled to the third terminal of the fifth transmission gate 134.

If the oscillator voltage source circuit 1 requires different input voltages, the digital signal SD controls different transmission gates to be turned on or off. For example, the first transmission gate 111 is turned on, while the second to fourth transmission gates 112-114 are turned off. Thus, a current passes from the multiplexer 110 through the first transmission gate 111 and the first resistor 115 and is directed by the current source circuit 12 and the output circuit 13 to generate one output voltage. When the second transmission gate 112 is turned on and the second, third, and fourth transmission gates 111, 113, and 114 are turned off, a current passes from the multiplexer 110 through the second transmission gate 112, the second resistor 116, and the first resistor 115 and is directed by the current circuit 12 and the output circuit 13 to generate another output voltage. Thus, through controlling different transmission gate to be turned on or off by the digital signal DS, the currents passes different number of resistors, so that output voltages with different values can be generated, and then the oscillator voltage source circuit 1 provides different output voltages. Because the number of resistors whereby one specific current pass is constant for each output voltage, the effect of the transmission gate impedance on the output voltages becomes smaller, reducing the deviation of the output voltages.

In this embodiment, the values of the first to fourth resistors 113 to 118 are the same. Moreover, the control circuit 11 uses four sets of the transmission and the resistor, without limitation. In applications, if the oscillator voltage source circuit is requested to provide more output voltages, more sets of the transmissions and the resistors are required.

In this embodiment, the control circuit 11 can be disposed on a chip. The values of the output voltages can be changed by the control of the digital signal DS, without manual control. Thus, the oscillator voltage source circuit 1 becomes more convenient in operation.

According to the aforementioned descriptions, the oscillator voltage source circuit of the invention has the advantage of less impedance deviation and high convenience, and the oscillator voltage source circuit provides stabilized output voltages to an oscillator. Thus, the oscillator voltage source circuit serves as an oscillator voltage source, and the oscillator is more stable.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A power source circuit for an oscillator, comprising
a multiplexer inputting a digital signal and outputting one or more the control signals;
a plurality of transmission gates individually coupled to the multiplexer and receiving the one or more control signals, wherein each of the plurality of transmission gate is turned on or off according to the one or more control signals;
a plurality of resistors coupled in series and individually coupled to the plurality of transmission gates, wherein one terminal of each of the transmission gates is coupled to the corresponding resistor and the other terminal of the each of the transmission gates is coupled to a ground;
a current source circuit coupled to the plurality of resistors and providing a current source; and
an output circuit coupled to the current source and providing output power for the oscillator according to the current source and the operation of the transmission gates.

2. The power source circuit as claimed in claim 1, wherein the current source circuit comprises a comparator and a voltage source.

3. The power source circuit as claimed in claim 1, wherein the output circuit comprises a plurality of metal oxide semiconductor (MOS) transistors and a plurality of inverters.

4. The power source circuit as claimed in claim 1, wherein the multiplexer, the plurality of transmission gates, the plurality of resistors, the current source circuit, and the output circuit are disposed on a chip.

5. The power source circuit as claimed in claim 4, wherein the chip controls the output of the power source circuit according to the one or more control signals.

6. The power source circuit as claimed in claim 1, wherein each of the plurality of transmission gates controls a pass path of a current according to the operation of the corresponding transmission gate.

7. The power source circuit as claimed in claim 6, wherein a number of resistors, whereby the current passes, is determined according to the turned-on transmission gate, and a value of the current is determined according to the determined number of the resistors.

8. The power source circuit as claimed in claim 6, wherein the current is affected by impedance of one of the plurality of the transmission gates.

* * * * *